(12) United States Patent
Meissner

(10) Patent No.: US 12,120,847 B1
(45) Date of Patent: Oct. 15, 2024

(54) CONTAINER FOR ONE OR MORE ELECTRONIC DEVICES AND METHODS OF USE THEREOF

(71) Applicant: Engendren LLC, Kenosha, WI (US)

(72) Inventor: Alan Paul Meissner, Franklin, WI (US)

(73) Assignee: Engendren LLC, Kenosha, WI (US)

( * ) Notice: Subject to any disclaimer, the term of this patent is extended or adjusted under 35 U.S.C. 154(b) by 67 days.

(21) Appl. No.: 17/701,536

(22) Filed: Mar. 22, 2022

Related U.S. Application Data

(60) Provisional application No. 63/164,971, filed on Mar. 23, 2021.

(51) Int. Cl.
*H05K 7/20* (2006.01)
*H04B 1/036* (2006.01)

(52) U.S. Cl.
CPC ......... *H05K 7/20336* (2013.01); *H04B 1/036* (2013.01); *H05K 7/20163* (2013.01); *H05K 7/20236* (2013.01); *H05K 7/20572* (2013.01); *H05K 7/20636* (2013.01); *H05K 7/20672* (2013.01)

(58) Field of Classification Search
CPC ........... H05K 7/20236; H05K 7/20136; H05K 7/20163; H05K 7/20336; H05K 7/20409; H05K 7/20554; H05K 7/20572; H05K 7/20636; H05K 7/20672; H05K 7/20681; H04Q 1/035; H04B 1/036
See application file for complete search history.

(56) References Cited

U.S. PATENT DOCUMENTS

| | | | |
|---|---|---|---|
| 3,741,292 A | 6/1973 | Aakalu et al. | |
| 4,700,272 A | 10/1987 | Bellamy | |
| 4,847,731 A | 7/1989 | Smolley | |
| 5,801,632 A | 9/1998 | Opal | |
| 5,842,514 A * | 12/1998 | Zapach | F28D 15/0275 165/135 |
| 6,050,327 A * | 4/2000 | Gates | H05K 7/20336 165/104.34 |
| 7,505,269 B1 * | 3/2009 | Cosley | F28D 15/0275 165/104.33 |
| 7,535,716 B2 * | 5/2009 | Fischer | H04Q 1/10 174/50.54 |
| 7,609,518 B2 | 10/2009 | Hopton et al. | |
| 8,009,419 B2 | 8/2011 | Attlesey et al. | |
| 8,619,425 B2 | 12/2013 | Campbell et al. | |

(Continued)

*Primary Examiner* — Zachary Pape
*Assistant Examiner* — Steven Ngo
(74) *Attorney, Agent, or Firm* — Brannen Law Office, LLC

(57) ABSTRACT

A container for one or more electronic devices is provided with a heat exchanger usable in extreme conditions to keep the contained electronic device(s) within a desired temperature range. The container has an external enclosure, insulation, an interior enclosure, and a heat exchanger. The electronic devices or components can be a board, a card or other type of electronic component, and they are contained within the interior enclosure. The interior enclosure is filled with a dielectric fluid. The heat exchanger is a passive heat exchanger and can be made of heat pipes. The heat exchanger has a first section within the interior enclosure and a second section exterior of the interior enclosure. Heat is drawn out of the interior enclosure through the interior enclosure shell and via the heat exchanger. Any water within the interior enclosure falls to the bottom of the interior enclosure.

22 Claims, 11 Drawing Sheets

(56) References Cited

U.S. PATENT DOCUMENTS

| | | | |
|---|---|---|---|
| 9,357,675 B2 | 5/2016 | Campbell et al. | |
| 10,321,609 B2 * | 6/2019 | Hirai | H05K 7/20236 |
| 10,405,459 B2 | 9/2019 | Campbell et al. | |
| 2001/0052412 A1 * | 12/2001 | Tikka | H05K 7/206 |
| | | | 165/104.34 |
| 2006/0007656 A1 | 1/2006 | Symons | |
| 2007/0034360 A1 | 2/2007 | Hall | |
| 2016/0286691 A1 | 9/2016 | Sprague et al. | |
| 2020/0281099 A1 * | 9/2020 | Klaba | H05K 7/20172 |
| 2021/0378142 A1 * | 12/2021 | Zhang | G06F 1/20 |

* cited by examiner

CONTAINER FOR ONE OR MORE ELECTRONIC DEVICES AND METHODS OF USE THEREOF

This United States utility patent application claims priority on and the benefit of provisional application 63/164,971 filed Mar. 23, 2021, the entire contents of which are hereby incorporated herein by reference.

BACKGROUND OF THE INVENTION

1. Field of the Invention

The present invention relates to a container for one or more electronic devices and methods of use thereof, and in particular to a container with a heat exchanger usable in extreme conditions to keep the contained electronic device(s) within a desired temperature range and methods of use thereof.

2. Description of the Related Art

There is a need to place electronic devices, such as the components that operate cellular and other networks, in many places. Often times, there is a need to place the electronic devices in remote areas or locations. In recent years, this need has been expanding, both geographically and in quantity of components. One challenge in meeting this need is to keep the electronic components protected from environmental conditions. Another need to manage heat so that the devices can remain operational. These needs entail shielding the components from elements and also managing cooling of the components.

Existing enclosures typically utilize refrigerant based systems. Refrigerant based systems consume a relatively large amount of energy during operation. Further, use of the refrigerant based systems requires that a power delivery system be developed and maintained.

Thus, there exists a need for a container for one or more electronic devices that solves these and other problems.

SUMMARY OF THE INVENTION

A container for one or more electronic devices (at least one device) is provided with a heat exchanger usable in extreme conditions to keep the contained electronic device(s) within a desired temperature range. The container has an external enclosure, insulation, an interior enclosure, and a heat exchanger. The electronic devices or components can be a board, a card or other type of electronic component, and they are contained within the interior enclosure. The interior enclosure is filled with a dielectric fluid. The heat exchanger is a passive heat exchanger and can be made of heat pipes. The heat exchanger has a first section within the interior enclosure and a second section exterior of the interior enclosure. Heat is drawn out of the interior enclosure through the interior enclosure shell and via the heat exchanger. Any water within the interior enclosure falls to the bottom of the interior enclosure.

According to one advantage of the present invention, the container protects electronic devices from adverse environmental conditions and manages the heat produced by the electronic devices. The electronic devices can be contained within an interior enclosure, which itself is contained within an exterior enclosure.

According to another advantage of the present invention, heat is passively removed from within the interior enclosure. This is advantageous as passive cooling does not need an energy supply to operate.

According to a further advantage of the present invention, the greater the temperature differential between sides of the heat exchanger, the greater the amount of heat transfer via the heat exchanger.

The interior enclosure can have an extruded shell with fins providing for free convective heat transfer to the outside of the interior enclosure. The convective heat transfer can be due to forced convection in some applications where there is not a sufficient temperature differential present.

A heat exchanger, such as one or more heat pipes, can have one section within the interior enclosure and a second section exterior of the interior enclosure to draw heat out of the interior enclosure when the temperature inside the interior enclosure is greater than the temperature exterior of the interior enclosure.

Related, the heat pipes can be oriented vertically within the container. This allows the lower section within the interior enclosure to be an evaporator to remove heat and the upper section exterior of the interior enclosure to be a condenser to deposit heat outside of the interior enclosure. Condensed liquid falls within the pipe and evaporated gas rises within the pipe.

According to a further advantage of the present invention, the interior enclosure is filled with a dielectric fluid. The lower end of the heat exchanger is submerged within the fluid. The upper end of the heat exchanger, exterior of the interior enclosure, interacts with air. The dielectric fluid aids in heat transfer and also protects the electronic devices within the interior enclosure. Any water within the interior enclosure (either environmental or condensate) falls to the bottom of the interior enclosure remote from the electronic devices as it has a higher specific gravity than the dielectric fluid.

According to a still further advantage of the present invention, the container can be mounted anywhere, such as on a pole. This allows the enclosure to be used almost anywhere, including in remote locations without other structures such as buildings. It is anticipated that the present invention will be useful in a wide range of environment conditions. For a non-limiting example, the present invention can be used when ambient temperatures are between −80 degrees Fahrenheit to 130 degrees Fahrenheit.

According to a still further advantage yet of the present invention, an air space between the insulation and the interior enclosure is created to provide an air gap. The air in the insulation cavity can be moved or exchanged with outside air via an optional air mover such as a fan.

According to a still further advantage yet of the present invention, an out-gas vent can be provided to allow any gasses forming within the interior enclosure to escape from the interior enclosure.

Other advantages, benefits, and features of the present invention will become apparent to those skilled in the art upon reading the detailed description of the invention and studying the drawings.

DETAILED DESCRIPTION OF PREFERRED EMBODIMENTS

While the invention will be described in connection with one or more preferred embodiments, it will be understood that it is not intended to limit the invention to those embodiments. On the contrary, it is intended to cover all alternatives, modifications and equivalents as may be included within the spirit and scope of the invention as defined by the appended claims.

Figure 1:
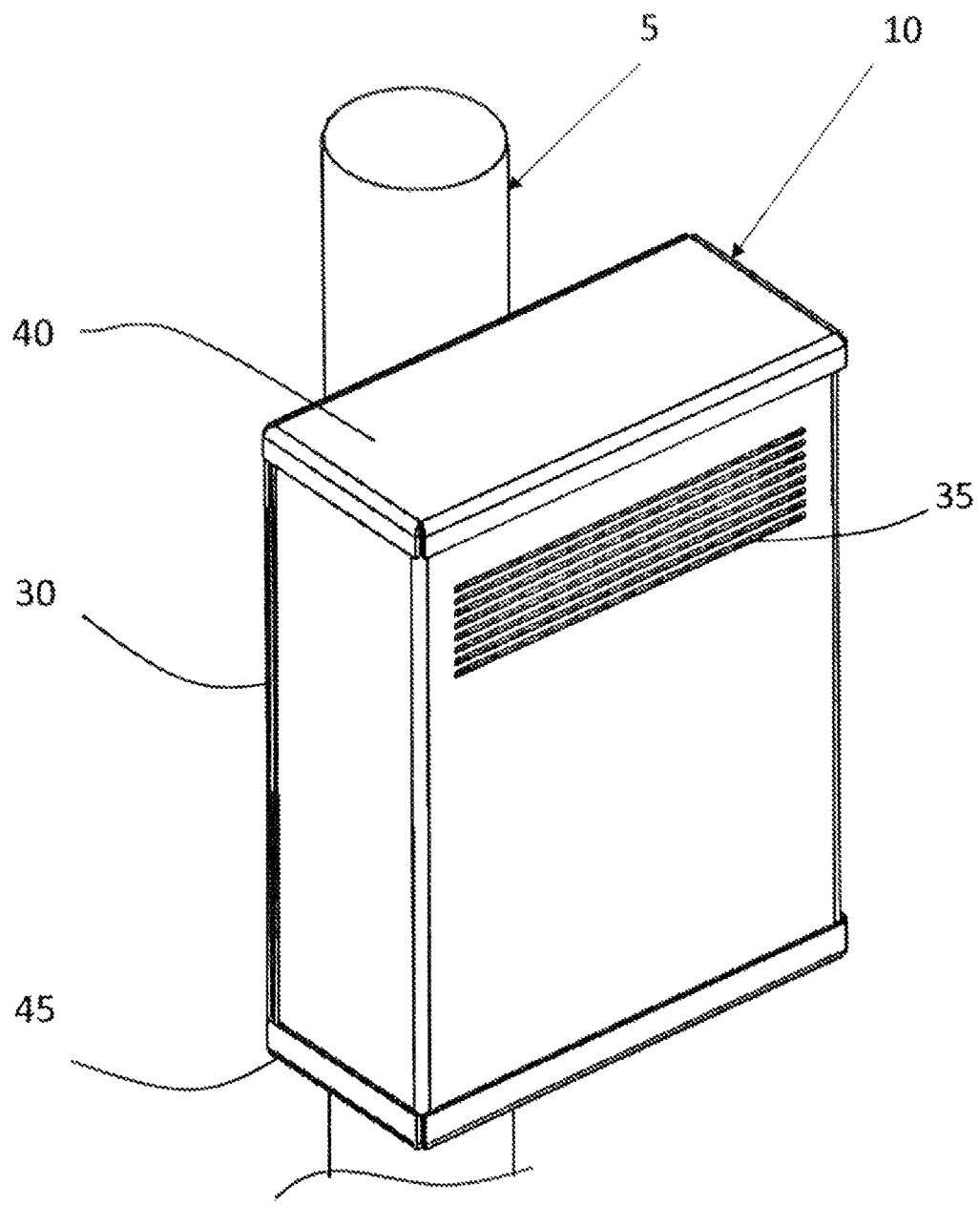
FIG. 1 is a perspective view of an embodiment of the present invention shown on a pole.

Embodiments of the present invention are illustrated in FIGS. 1-14. A container 10 is shown in FIG. 1 being mounted to a pole 5. It is appreciated that the container could be mounted to other structures without departing from the broad aspects of the present invention. The container 10 has an external enclosure 20, and interior enclosure 80 containing electronics 120 and a heat exchanger 150. Each of these components, and other components, are described below.

Figure 1A:
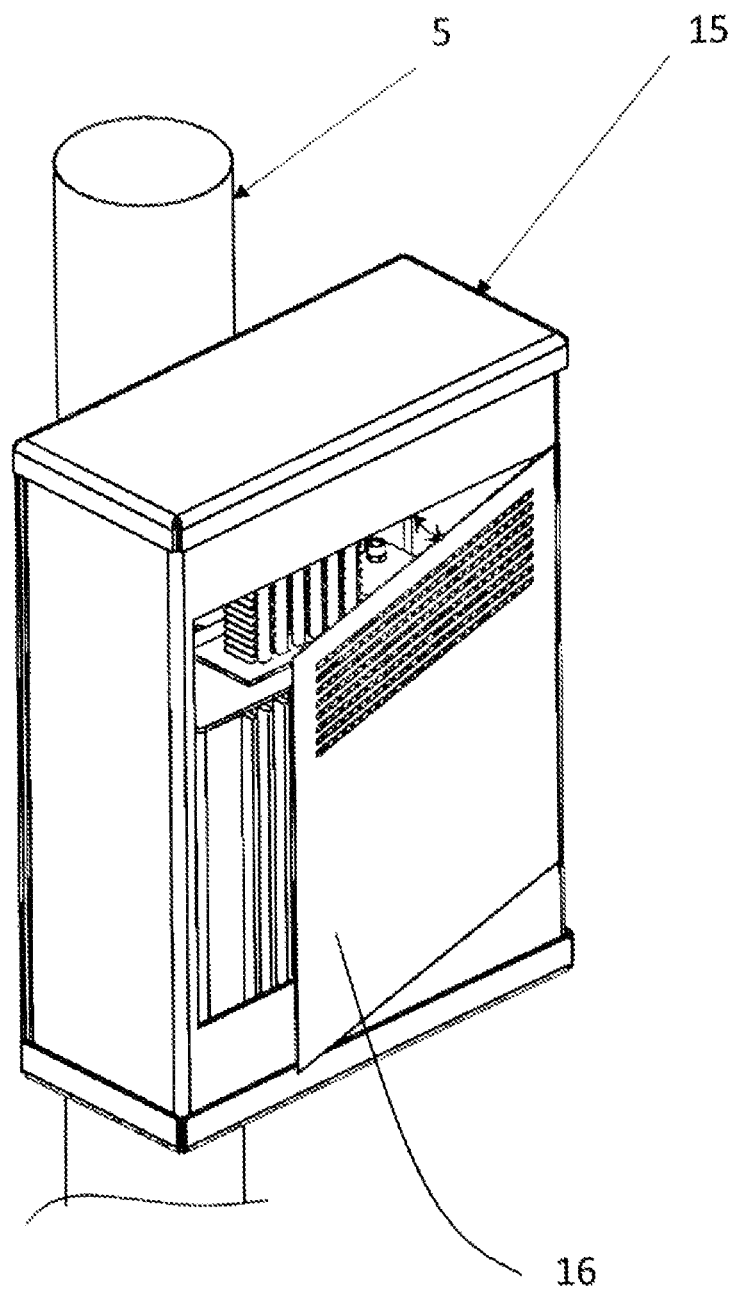
FIG. 1A is a perspective view of an embodiment of the present invention having an optional door and shown on a pole.
Figure 2:
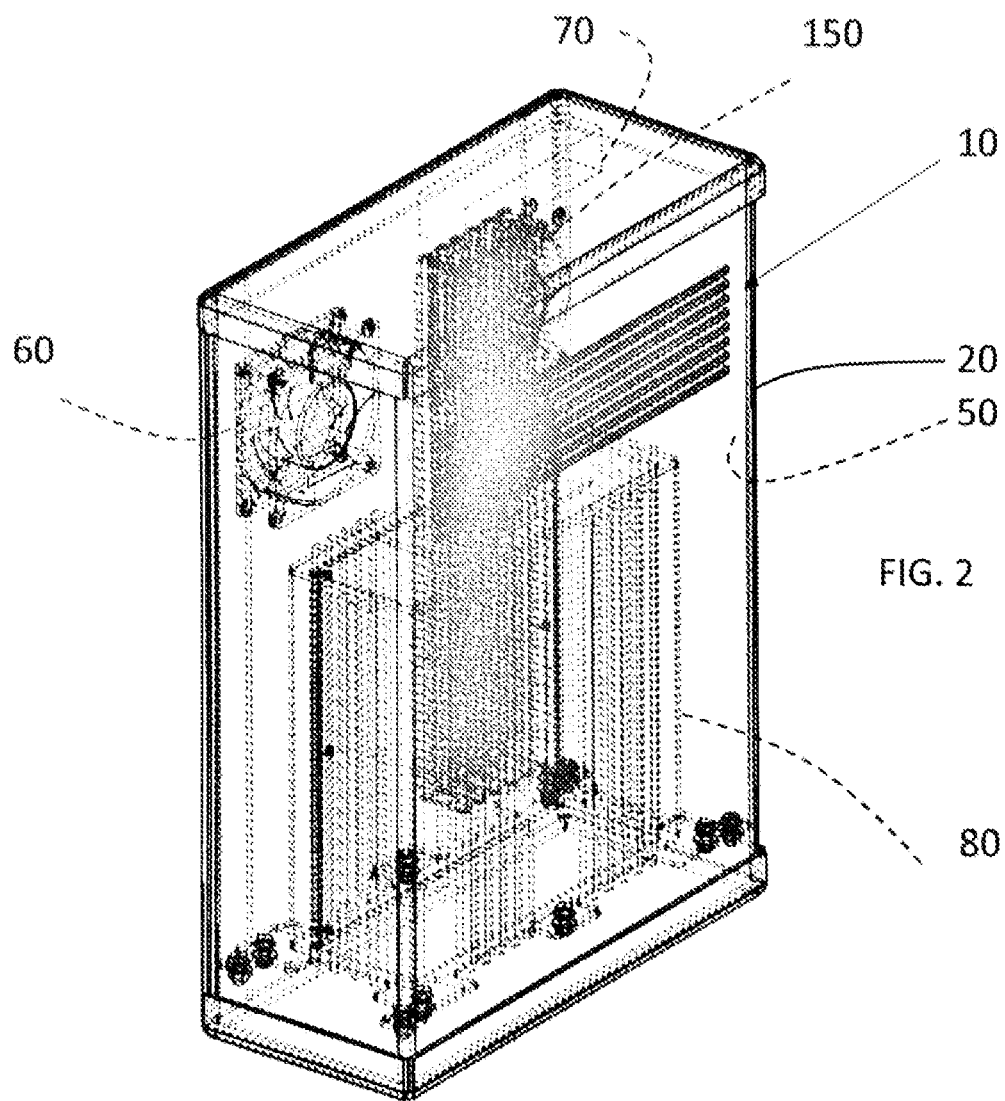
FIG. 2 is a perspective view of the embodiment of FIG. 1.
Figure 3:
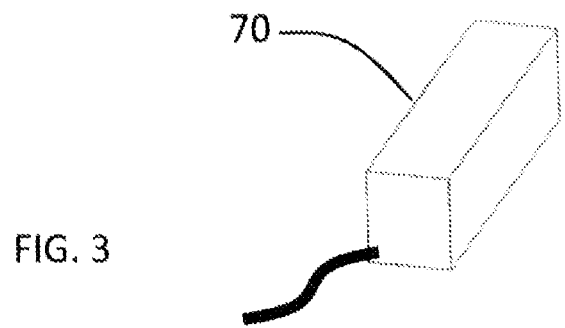
FIG. 3 is an isolation schematic view of a power supply.
Figure 4:
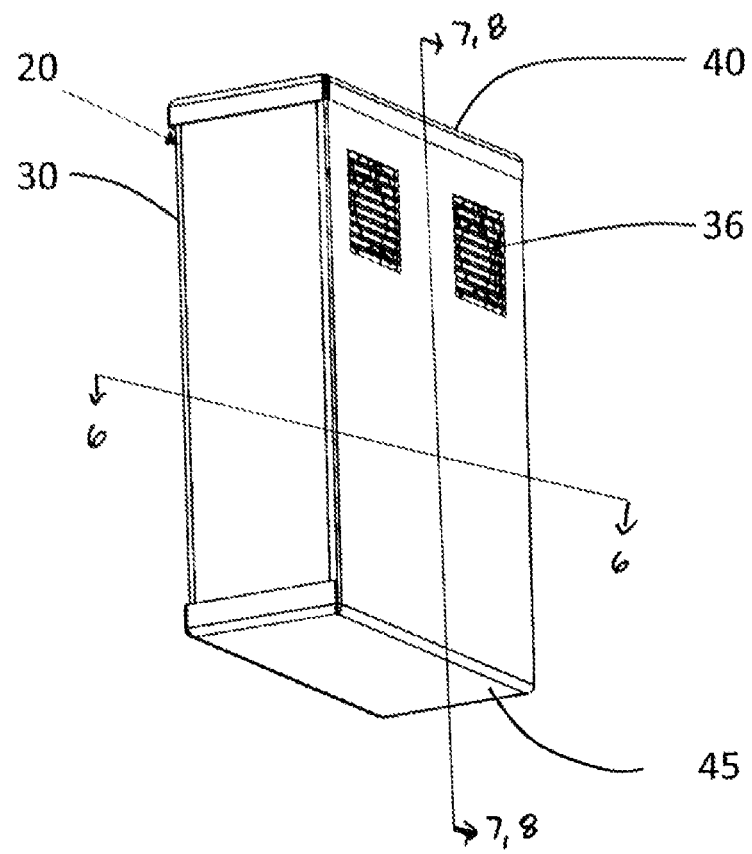
FIG. 4 is a perspective view of a preferred embodiment of the present invention showing the external enclosure.
Figure 5:
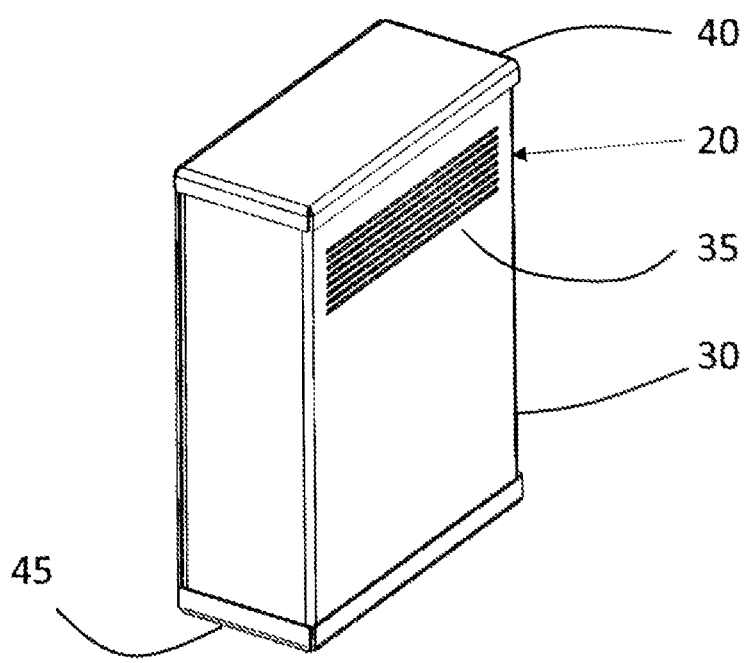
FIG. 5 is a reverse perspective view of the embodiment illustrated in FIG. 4.
Figure 6:
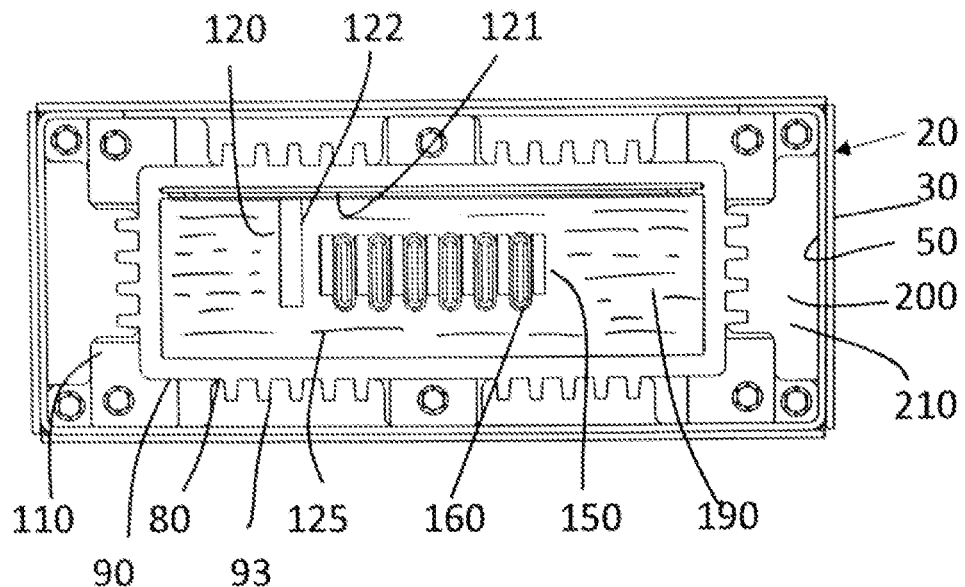
FIG. 6 is a sectional view taken along line 6-6 in FIG. 4.
Figure 7:
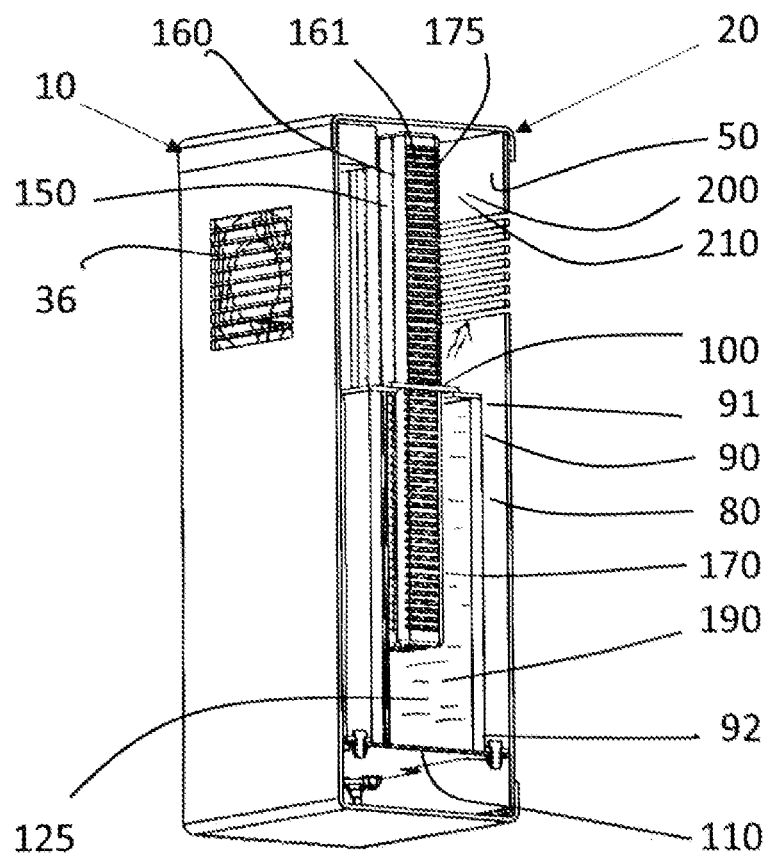
FIG. 7 is a sectional perspective view taken along line 7-7 in FIG. 4.
Figure 8:
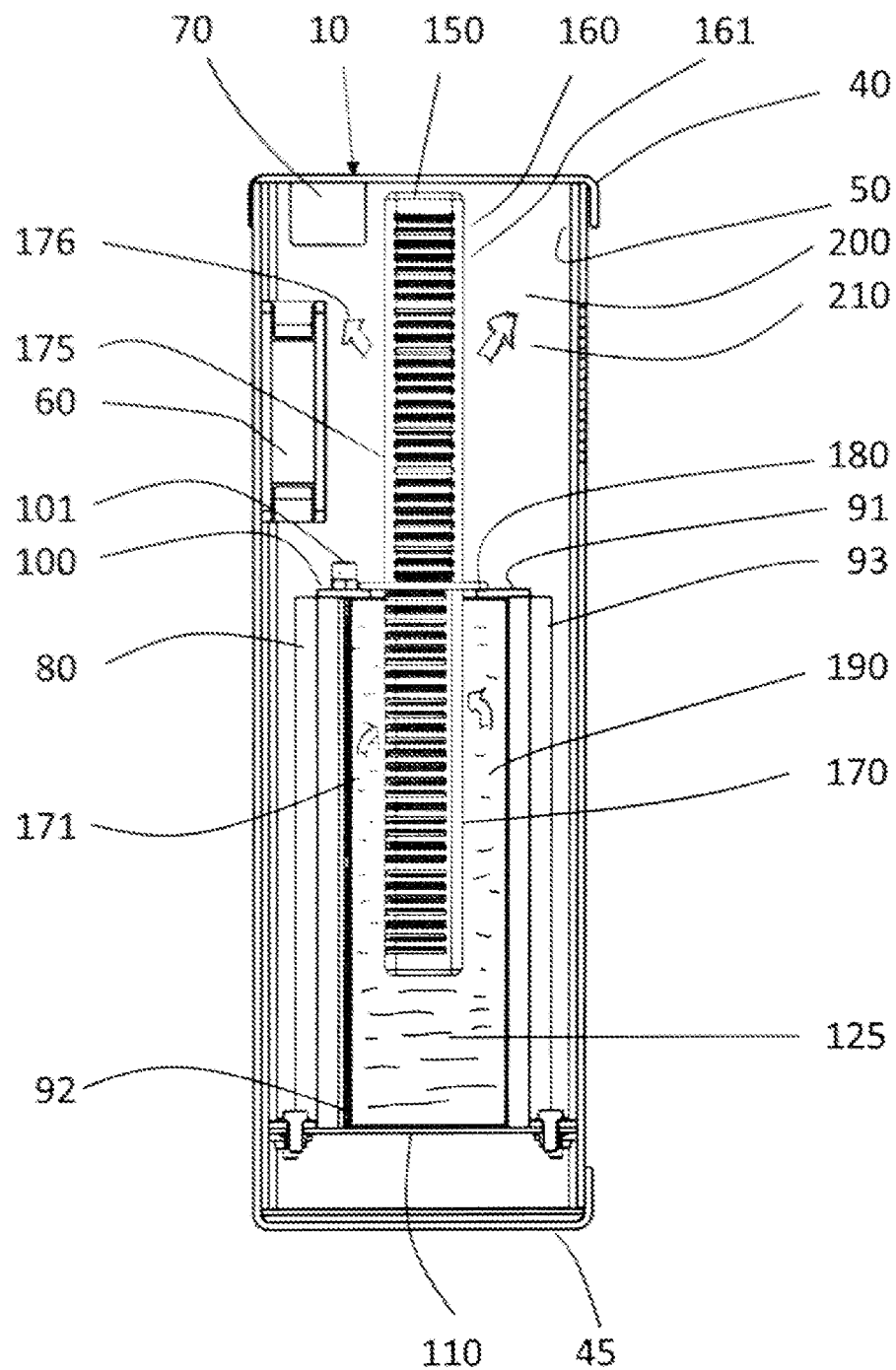
FIG. 8 is a sectional view taken along line 8-8 in FIG. 4.
Figure 9:
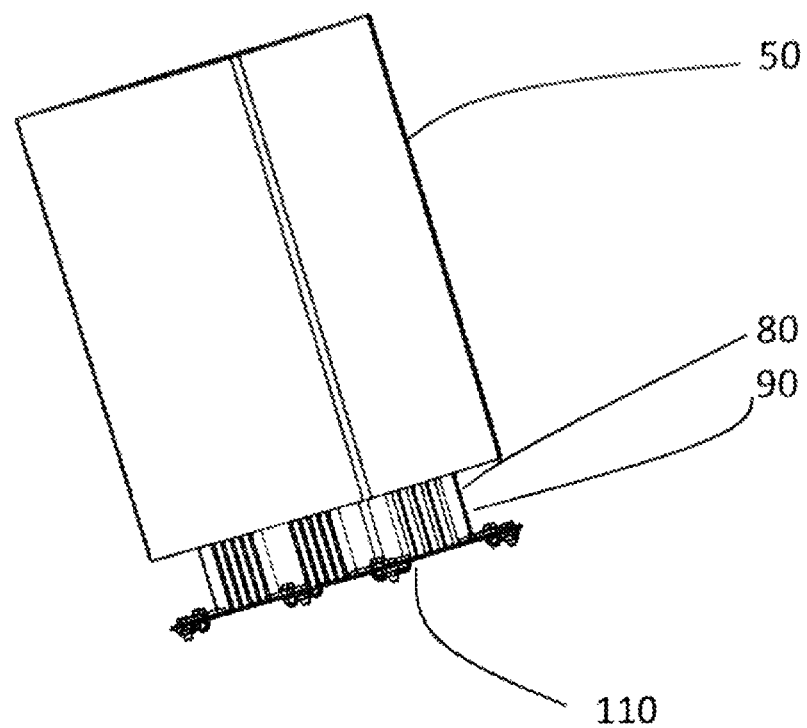
FIG. 9 is a perspective view showing insulation and a lower end of an interior enclosure.
Figure 10:
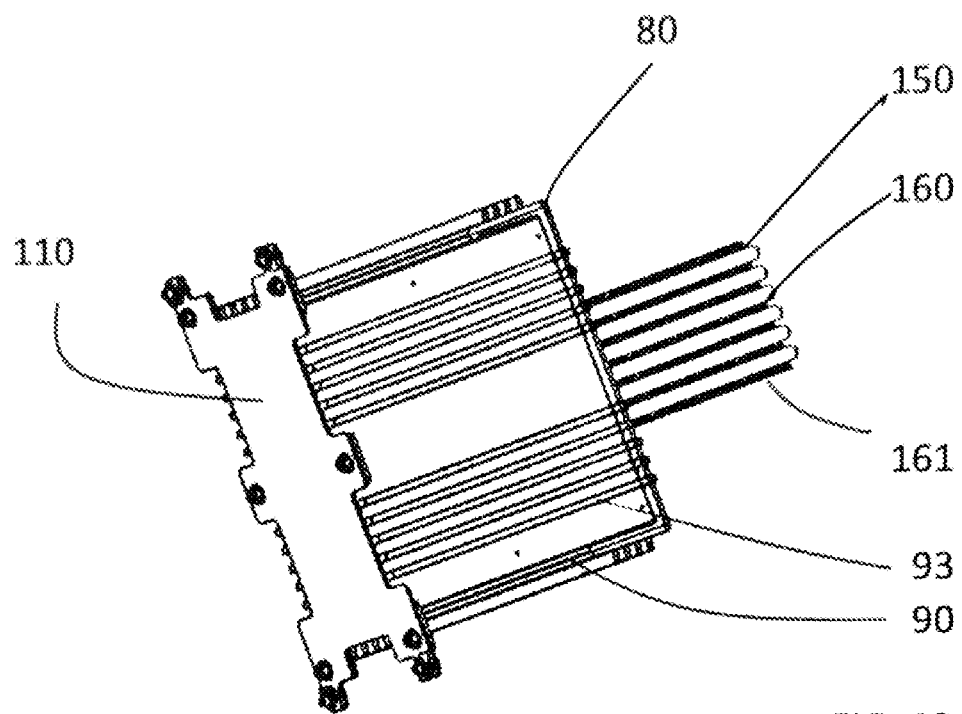
FIG. 10 is a perspective view showing the interior enclosure and heat exchanger.
Figure 11:
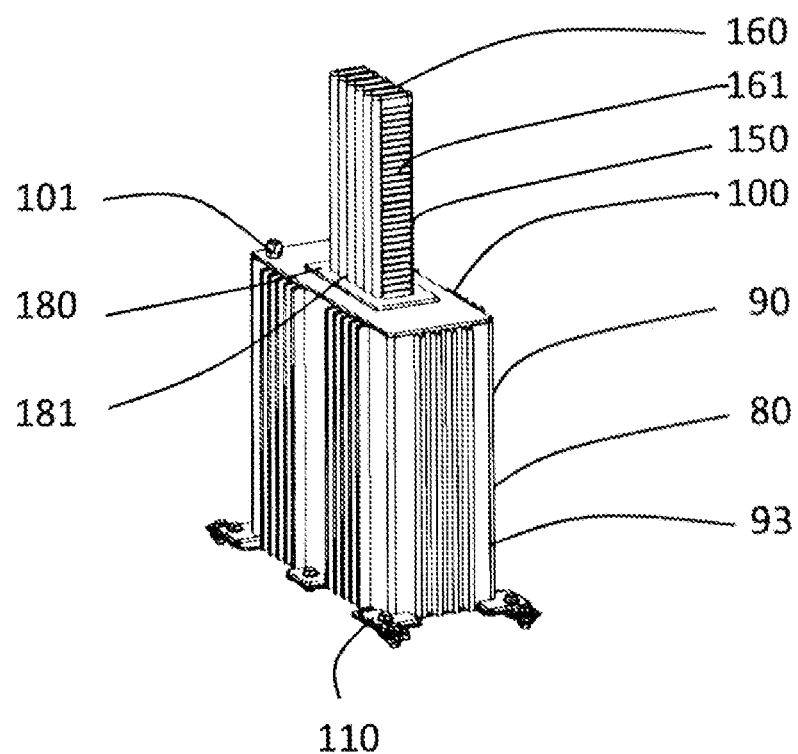
FIG. 11 is a reverse perspective view of FIG. 10.
Figure 12:
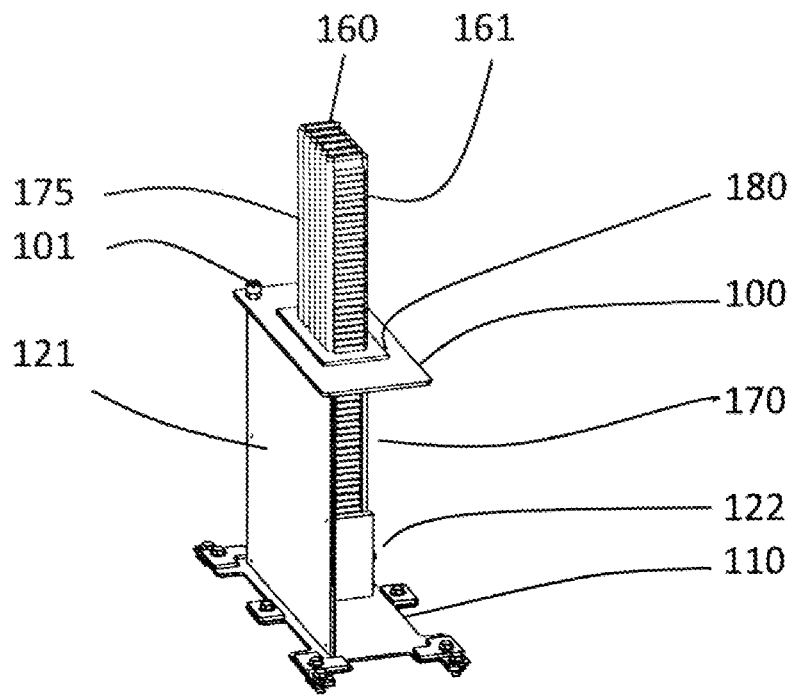
FIG. 12 is a perspective view showing the heat exchanger, electronic components, and part of the interior enclosure.
Figure 13:
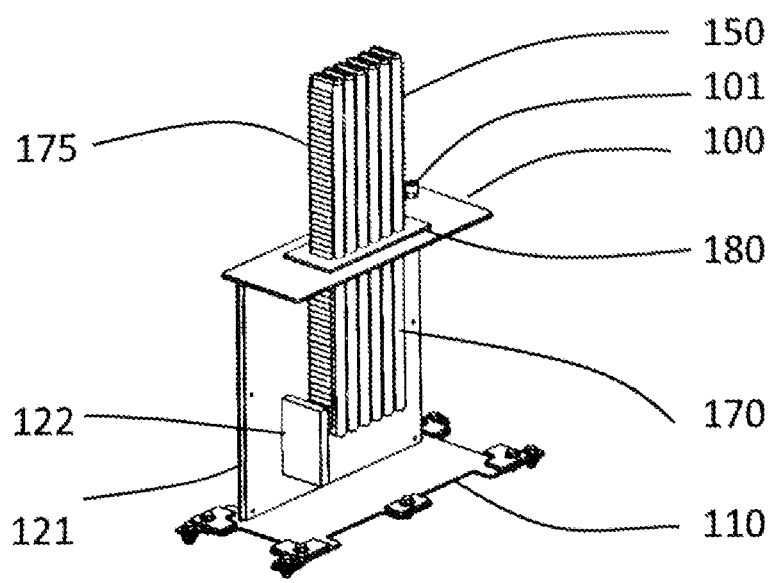
FIG. 13 is a reverse perspective view of FIG. 12.
Figure 14:
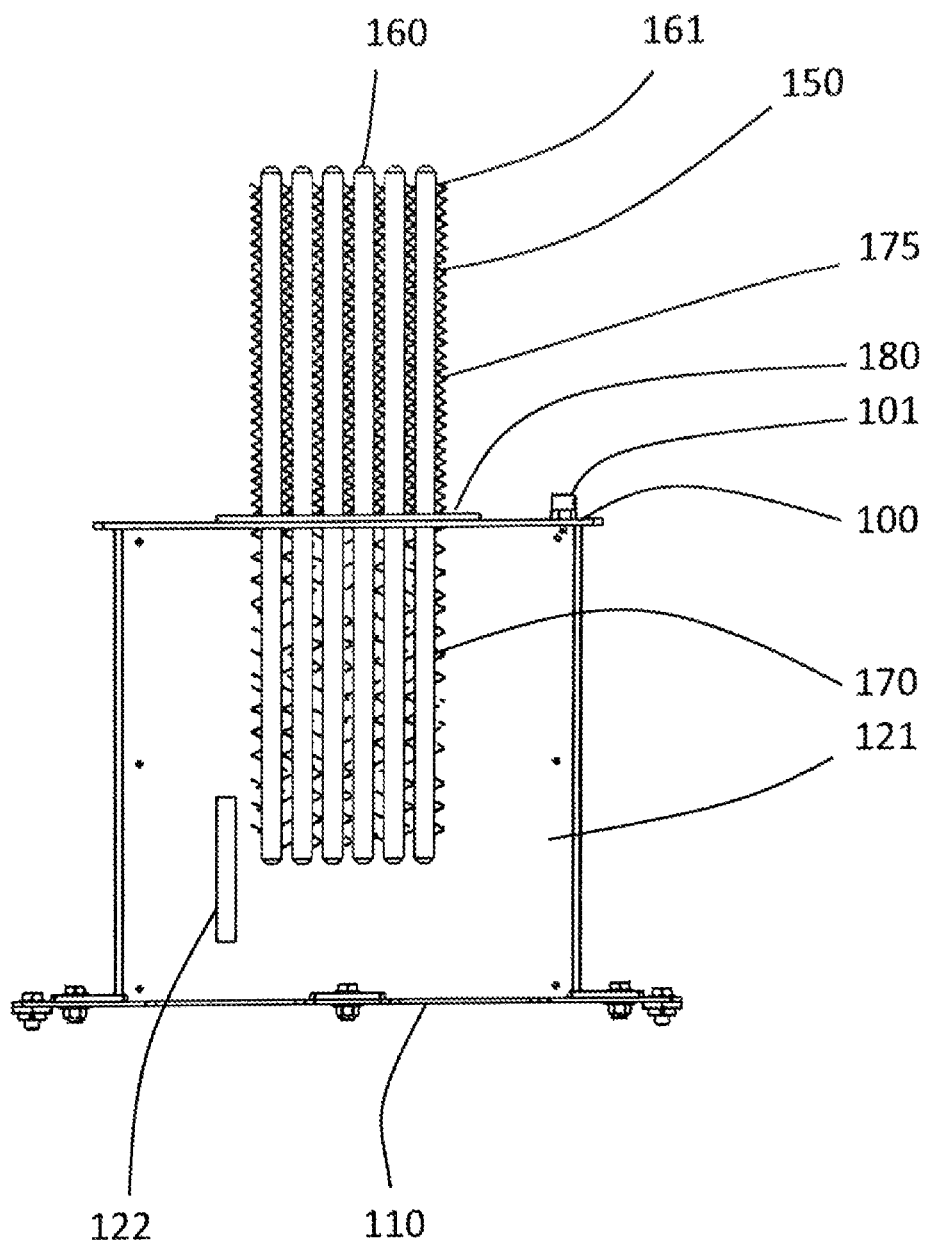
FIG. 14 is a side view of FIG. 12.

An external enclosure 15 with an optional door 16 with a vent is shown in FIG. 1A. The door can be sealed with a gasket and the rear section of the shell can be mounted to a pole or other structure.

An external enclosure 20, without a door or side access panel, is best seen in FIGS. 1, 2, 4 and 5. The external enclosure 20 can, in one embodiment, be about 30 inches tall, 20 inches wide and 12 inches deep. These dimensions can be altered without departing from the broad aspects of the present invention. The external enclosure can be made of aluminum or another suitable material preferably having a high heat transfer coefficient and is suitable for exterior use. External enclosure 20 has a shell 30, a top piece 40 and a bottom piece 45. The top piece 40 can be removed from the shell in order to access the interior of the external enclosure. The shell 30 can have a front vent 35 and one or more rear vents 36.

Insulation 50, in the shape of a shell, can be on the inside surface of the shell 30 of the external enclosure 20. The insulation 50 can allow air to move through the vents of the shell 30. An optional air mover 60 such as a fan can be provided. The air mover 60 can forcibly exchange air 210 inside an exterior enclosure cavity 200 with outside air. A power supply 70 is also provided. The power supply 70 is preferably affixed to the top piece 40 of the external enclosure.

The interior enclosure 80 is best seen in FIGS. 6-11. The interior enclosure 80 (also could be called inner enclosure or internal enclosure) has a shell 90. The shell 90 is preferably an extruded shell made of aluminum or another material with a high heat transfer coefficient. The shell 90 preferably has external fins 93 aiding in convective heat transfer to the external enclosure cavity 200 external of the interior enclosure 80. The fins 93 preferably are vertically oriented between a shell top 91 and bottom 92. A top plate 100 is at the top 91 of the shell 90 and a bottom plate 110 is at the bottom 92 of the shell. The bottom plate 110 is also a mounting plate that mounts the interior enclosure within the external enclosure 20. There is preferably an air gap on all sides of the interior enclosure 80 from the insulation 50 and top and bottom of the external enclosure. The shell 90, top plate 100 and bottom plate 110 form a sealed interior enclosure cavity 190.

An out-gas vent 101 is preferably located through the top plate 100 of the interior enclosure 80. Gasses can form within the enclosure because of heat. The vent 101 allows those gases to escape from the interior enclosure 80. The gasses accumulate at the top of the enclosure 80 and can pass through the vent 101. The vent does not allow liquid to pass through it in either direction. In this regard, any liquid that is present in the exterior enclosure (but external of the interior enclosure) cannot pass into the interior enclosure. Also, none of the dielectric fluid 125 within the interior enclosure can escape from the interior enclosure through the vent.

The interior enclosure can contain one or more electronic devices or electronics 120, such as a board 121 and a card 122. The interior enclosure can contain or house other electronics, depending upon the application, without departing from the broad aspects of the present invention. In this regard, the invention is not limited to particular contained electronics. The interior enclosure 80 is preferably filled with a suitable dielectric fluid 125, such as but limited to a dielectric oil.

The heat exchanger 150 is preferably a passive heat exchanger comprising at least one heat pipe 160. There are six heat pipes 160 shown in the illustrated embodiment. Yet, there could be more or fewer heat pipes utilized in a given application without departing from the broad aspects of the present invention. The heat pipes 160 have fins 161 on their external sides aiding in heat transfer. Each heat pipe is preferably generally vertically oriented within the container. The bottom of each heat pipe is an evaporator, and the top is a condenser. In this regard, a working medium that evaporates and condenses at desired temperatures is selected depending upon the application. Further, the heat pipes are built with sufficient surface area to effectively accommodate anticipated amounts of heat dissipation. The heat exchanger 150 has a bottom section 170 received within the interior enclosure cavity (to remove heat 171) and a top section 175 within the exterior enclosure cavity 200 external of the interior enclosure 80 (to release heat 176). The bottom section 170 of the heat exchanger 150 is preferably submerged within the dielectric fluid. The top section 175 is preferably exposed to air.

A sealing plate 180 with a central opening 181 is provided for sealing the interior enclosure cavity 190 from the exterior enclosure cavity in the area where the heat exchanger is located. The top plate 100 of the interior enclosure 80 separates the heat exchanger 150 into the bottom portion 170 and top portion 175. The heat exchanger 150 is preferably symmetrical about the top plate 100 of the interior enclosure.

The heat exchanger 150 removes heat from the interior enclosure cavity 190 and moves it to the exterior enclosure cavity 200 external of the interior enclosure. The air 210 in the exterior enclosure cavity that is external of the interior enclosure can be exchanged with outside air to remove the heat from the exterior enclosure cavity.

Any water within the interior enclosure 80 is separated from the dielectric fluid and is contained at the bottom of the interior enclosure remote from the card 122 or other electrical components.

Figure 15:
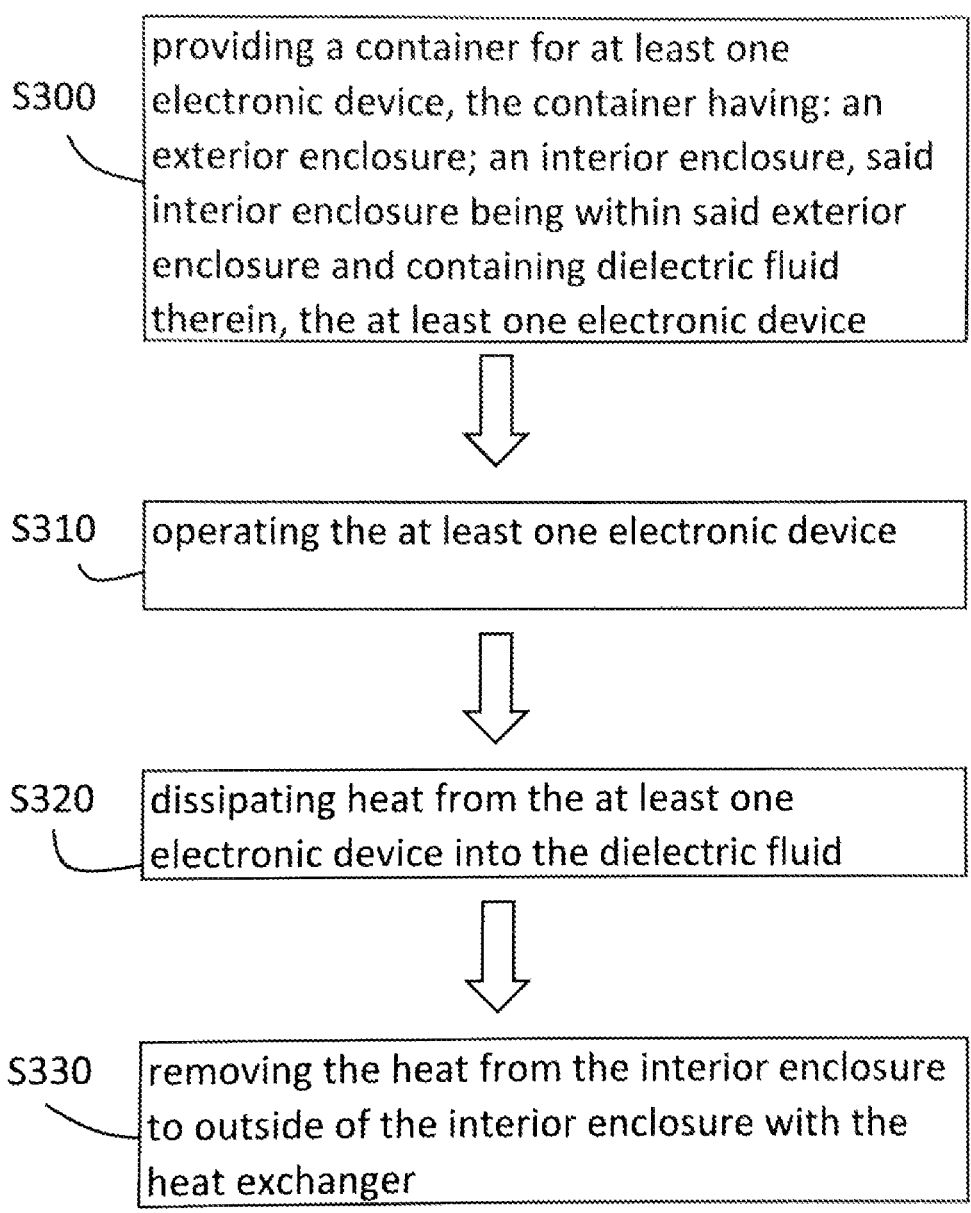
FIG. 15 is a flow chart showing a preferred use of the present invention.

In a preferred method of use of the container as illustrated in FIG. 15, the container can be used by following the steps of:
- (S300) providing a container for at least one electronic device, the container having: an exterior enclosure; an interior enclosure, said interior enclosure being within said exterior enclosure and containing dielectric fluid therein, the at least one electronic device being within the interior enclosure and submerged within the dielectric fluid; and a heat exchanger, said heat exchanger being a passive heat exchanger with a first end submerged within the dielectric fluid within said interior enclosure and a second end outside of said interior enclosure and inside of said exterior enclosure;
- (S310) operating the at least one electronic device;
- (S320) dissipating heat from the at least one electronic device into the dielectric fluid; and
- (S330) removing the heat from the interior enclosure to outside of the interior enclosure with the heat exchanger.

The method just presented above, in the step of providing a container, the step could further comprise the step of providing a heat exchanger that is a heat pipe, and the step could further comprise the step of vertically orienting the heat pipe within the container.

The method provided above could further comprise the steps of: providing an air mover; and exchanging air from inside of the exterior enclosure with air from outside of the exterior enclosure.

The method provided above, in the step of providing a container, could further comprises the step of providing an outgas vent on the interior enclosure.

It is appreciated that the interior of external enclosure 20 can be accessed by removal of the top piece 40. The power supply 70 is preferably connected to the top piece 40, and the removal of the top piece will also remove the power supply and allow easy access to the remainder of the contents of the enclosure, which can be selectably slid in and out of the external enclosure.

Thus, it is apparent that there has been provided, in accordance with the invention, a container for one or more electronic devices and methods of use thereof that fully satisfies the objects, aims and advantages as set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. A container for at least one electronic device, said container comprising:
   an exterior enclosure;
   an interior enclosure, said interior enclosure being within said exterior enclosure and containing dielectric fluid therein, the at least one electronic device being within the interior enclosure, said interior enclosure comprising a top plate, a shell and a bottom plate, wherein said bottom plate is also a mounting plate that mounts said interior enclosure within the exterior enclosure; and
   a heat exchanger, said heat exchanger being a passive heat exchanger with a first end within said interior enclosure and a second end outside of said interior enclosure and inside of said exterior enclosure, said first end of said heat exchanger being submerged in said dielectric fluid.

2. The container of claim 1 wherein said at least one electronic device is submerged in said dielectric fluid.

3. The container of claim 1 wherein said heat exchanger is a heat pipe.

4. The container of claim 3 wherein said heat pipe is vertically oriented within said container.

5. The container of claim 1 wherein said interior enclosure comprises said shell, said shell comprising fins.

6. The container claim 1 wherein:
   said exterior enclosure has an inside;
   a shell of insulation is on an inside of said exterior enclosure; and
   an air gap containing air is between said shell of insulation and said interior enclosure.

7. The container of claim 6 wherein said air contained within said air gap can be exchanged with outside air.

8. The container of claim 1 wherein said container is operational between −80 degrees Fahrenheit and 130 degrees Fahrenheit.

9. The container of claim 1 wherein said dielectric fluid is a liquid and the container further comprises an out-gas vent on said interior enclosure.

10. The container of claim 1 wherein said dielectric fluid is a dielectric oil that surrounds said first end of said heat exchanger within said interior enclosure.

11. A container for at least one electronic device, said container comprising:
   an exterior enclosure;
   an interior enclosure within said exterior enclosure, said interior enclosure containing dielectric fluid therein that is a liquid and the at least one electronic device being within the interior enclosure and submerged within said dielectric fluid, said interior enclosure comprising a top plate, a shell and a bottom plate, wherein said bottom plate is also a mounting plate that mounts said interior enclosure within said exterior enclosure; and
   a heat exchanger, said heat exchanger comprising at least one heat pipe with a first end within said interior enclosure submerged within said dielectric fluid, and a second end outside of said interior enclosure and inside of said exterior enclosure.

12. The container of claim 11, wherein said interior enclosure comprises said shell, said shell comprising fins.

13. The container of claim 11 wherein said at least one heat pipe is vertically aligned within said container.

14. The container of claim 11, wherein:
   said exterior enclosure has an inside;
   a shell of insulation is on an inside of said exterior enclosure;
   an air gap containing air is between said shell of insulation and said interior enclosure, wherein said air contained within said air gap can be exchanged with outside air.

15. The container of claim 11 further comprising an out-gas vent on said interior enclosure.

16. The container of claim 11 wherein said dielectric fluid is a dielectric oil that surrounds said first end of said heat pipe within said interior enclosure.

17. A method comprising the steps of:
providing a container for at least one electronic device, the container having:
an exterior enclosure;
an interior enclosure, said interior enclosure being within said exterior enclosure and containing dielectric fluid therein, the at least one electronic device being within the interior enclosure and submerged within the dielectric fluid, said interior enclosure comprising a top plate, a shell and a bottom plate, wherein said bottom plate is also a mounting plate that mounts said interior enclosure within the exterior enclosure; and
a heat exchanger, said heat exchanger being a passive heat exchanger with a first end submerged within the dielectric fluid within said interior enclosure and a second end outside of said interior enclosure and inside of said exterior enclosure; and
operating the at least one electronic device;
dissipating heat from the at least one electronic device into the dielectric fluid; and
removing the heat from the interior enclosure to outside of the interior enclosure with the heat exchanger.

18. The method of claim 17 wherein the step of providing a container further comprises the step of providing a heat exchanger that is a heat pipe.

19. The method of claim 18 wherein the step of providing a container further comprises the step of vertically orienting the heat pipe within the container.

20. The method of claim 17 further comprising the steps of:
providing an air mover; and
exchanging air from inside of the exterior enclosure with air from outside of the exterior enclosure.

21. The method of claim 17 wherein the step of providing a container further comprises the steps of having the dielectric fluid be a liquid and of providing an out-gas vent on the interior enclosure.

22. The method of claim 17 wherein the dielectric fluid is a dielectric oil that surrounds the first end of said heat exchanger within said interior enclosure.

* * * * *